(12) United States Patent
Fukuoka et al.

(10) Patent No.: US 8,066,806 B2
(45) Date of Patent: Nov. 29, 2011

(54) SINTERED SILICON OXIDE FOR FILM VAPOR DEPOSITION, ITS PRODUCTION METHOD, AND METHOD FOR PRODUCING SILICON OXIDE VAPOR DEPOSITION FILM

(75) Inventors: Hirofumi Fukuoka, Annaka (JP); Meguru Kashida, Annaka (JP); Toshio Ohba, Annaka (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 13/040,838

(22) Filed: Mar. 4, 2011

(65) Prior Publication Data

US 2011/0159303 A1 Jun. 30, 2011

Related U.S. Application Data

(62) Division of application No. 12/399,590, filed on Mar. 6, 2009, now Pat. No. 7,998,263.

(30) Foreign Application Priority Data

Mar. 12, 2008 (JP) ................................. 2008-062071

(51) Int. Cl.
*C01B 33/113* (2006.01)
*C23C 16/40* (2006.01)

(52) U.S. Cl. ....... 106/1.25; 423/324; 423/325; 423/335; 427/248.1; 427/255.11; 427/255.19; 438/778

(58) Field of Classification Search .................. 423/324, 423/325, 335; 427/248.1, 255.11, 255.18, 427/255.19; 438/778
See application file for complete search history.

(56) References Cited

U.S. PATENT DOCUMENTS

| 2,456,899 | A |   | 12/1948 | Strong |
|---|---|---|---|---|
| 3,061,577 | A | * | 10/1962 | Pruett ........................... 523/216 |
| 5,137,955 | A | * | 8/1992 | Tsuchiya et al. ............... 524/310 |
| 5,389,591 | A |   | 2/1995 | Guigonis et al. |
| 6,660,671 | B2 |   | 12/2003 | Werdecker et al. |
| 7,151,068 | B2 |   | 12/2006 | Natsume et al. |
| 2007/0166219 | A1 |   | 7/2007 | Arimoto et al. |
| 2009/0117023 | A1 |   | 5/2009 | Natsume |

FOREIGN PATENT DOCUMENTS

| JP | 08-296036 | 11/1996 |
|---|---|---|
| JP | 09-110412 | 4/1997 |
| JP | 2001-348656 | 12/2001 |
| JP | 2002-97567 | 4/2002 |
| JP | 2006-348348 | 12/2006 |
| WO | WO 03/082769 | 10/2003 |
| WO | WO 03082769 A1 * | 10/2003 |

OTHER PUBLICATIONS

Foreign Office Action dated Jun. 30, 2008.

* cited by examiner

*Primary Examiner* — Stuart Hendrickson
*Assistant Examiner* — Syed Iqbal
(74) *Attorney, Agent, or Firm* — Oblon, Spivak, McClelland, Maier Neustadt, L.L.P.

(57) ABSTRACT

A sintered silicon oxide for film vapor deposition having a density of 1.0 to 2.0 g/cm$^3$, three-point flexural strength of at least 50 g/mm$^2$, and a BET specific surface area of 0.1 to 20 m$^2$/g is provided. When this sintered silicon oxide is used for evaporation source of a film, pin holes and other defects of the film caused by the problematic splash phenomenon can be reliably prevented and stable production of a reliable package material having excellent gas barrier property is been enabled. This invention also provides a method for producing such sintered silicon oxide, and this method can be used in a large scale production without requiring any special technology, and therefore, this method is capable of supplying the market with the sintered silicon oxide at reduced cost.

10 Claims, No Drawings

SINTERED SILICON OXIDE FOR FILM VAPOR DEPOSITION, ITS PRODUCTION METHOD, AND METHOD FOR PRODUCING SILICON OXIDE VAPOR DEPOSITION FILM

CROSS-REFERENCE TO RELATED APPLICATION

This application is a Divisional of U.S. application Ser. No. 12/399,590, filed on Mar. 6, 2009, which is a non-provisional application which claims priority under 35 U.S.C. §119(a) to Japanese Patent Application No. 2008-062071, filed on Mar. 12, 2008, the entire contents of which are hereby incorporated by reference.

TECHNICAL FIELD

This invention relates to a sintered silicon oxide for film vapor deposition used in producing a film having excellent gas barrier properties usable for packaging food, medical supplies, and medicine. This invention also relates to its production method and a method for producing a silicon oxide vapor deposition film.

BACKGROUND OF THE INVENTION

In the field of foods, prevention of quality decline due to oxidation caused by oxygen and water vapor passing through the packaging material has been required to thereby prevent deterioration of the fat/oil and proteins. In the field of medical supplies and medicine, quality change and deterioration of the content in the package should be prevented at an even higher level. Packaging materials including an aluminum foil or an aluminum vapor deposition film have been used for the packaging material in such field. Use of such materials, however, has become problematic due to the adverse environmental effects associated with the discarding of such materials.

In view of such situation, a wide attention is being given to a silicon oxide vapor deposition film comprising a polymer film having silicon oxide formed thereon by vapor deposition, as a packaging material having a high gas barrier property which is not associated with any particular problem in the course of incineration. This silicon oxide vapor deposition film having excellent gas barrier properties is produced by evaporating a silicon oxide evaporation source by resistance heating, electron-beam heating, or the like to thereby evaporate the silicon oxide and deposit the silicon oxide vapor deposition film on the film substrate.

The silicon oxide which is used for the evaporation source has been produced by various methods. For example, JP-A 9-110412 discloses a method in which the silicon oxide is produced by depositing the silicon oxide on a surface-roughened metal substrate. JP-A 2002-97567 discloses a silicon monoxide material having an average bulk density of at least 2.0 g/cm³ and a Vickers hardness of at least 500 as well as its production method. These prior art technologies are respectively an attempt to prevent formation of pin holes on the film caused by a "splash" (splashing of the material in the heating) which had been the problem associated with the vapor deposition of the silicon oxide.

However, while these conventional methods have been effective in reducing the degree of splash, and hence, in reducing the defects such as pinholes formed on the film, such improvement has still been insufficient, and the inventors believe that there is still room for further improvements. More specifically, the silicon oxide produced by such conventional technology had mainly been the one produced by precipitating the silicon oxide vapor on the substrate and peeling the deposited silicon oxide from the substrate, and accordingly, inconsistent in shape, size, thickness, and other physical properties. Use of such material for the evaporation source resulted in the considerable lot-to-lot variation in the course of the vapor deposition, and stable reduction of the splash was difficult. In addition, insufficient strength of the silicon oxide often resulted in the generation of fine powder, and this powder often caused the splash.

SUMMARY OF THE INVENTION

The present invention has been accomplished in view of the situation as described above, and an object of the present invention is to provide a sintered silicon oxide for film vapor deposition which is capable of stably reducing the occurrence of splash to thereby produce a highly reliable gas barrier film, as well as its production method. Another object of the present invention is to provide a method for producing a silicon oxide vapor deposition film.

The inventors of the present invention made an extensive study on the silicon oxide used as the evaporation source in order to stably reduce the occurrence of splash to thereby produce a highly reliable gas barrier film, and found that the occurrence of the splash can be substantially suppressed and a highly reliable gas barrier film can be produced when the sintered silicon oxide used for the evaporation source has predetermined physical properties including particular density and specific surface area as well as an improved strength.

More specifically, the inventors of the present invention analyzed the cause for the occurrence of the splash as an attempt to prevent the splash, and then found that the frequency of the splash occurrence varies by the lot used in the vapor deposition process, and the cause for the splash occurrence is highly likely to be lot-to-lot inconsistency in the density and specific surface area and insufficient strength of the evaporation source. In view of such situation, the inventors of the present invention made an intensive study to improve the density, the strength, and the specific surface area of the evaporation source, and found that the lot-by-lot variation can be remarkably reduced by using a sintered body which had been produced by molding and sintering the silicon oxide powder by a particular process for the evaporation source, and the splash can be greatly reduced by increasing the strength of the sintered body.

The inventors of the present invention further found that the sintered silicon oxide having a density of 1.0 to 2.0 g/cm³, a three-point flexural strength of at least 50 g/mm², and a BET specific surface area of 0.1 to 20 m²/g is effective for use as such sintered body; that such sintered silicon oxide can be manufactured by molding a mixture of the silicon oxide powder represented by the formula: $SiO_x$ ($1 \leq x < 1.2$) and the silicon dioxide ($SiO_2$) powder, and sintering the molded article in a non-oxidizing atmosphere at a temperature in the range of 700 to 1400° C.; and that, by heating this sintered silicon oxide for film vapor deposition to deposit the vapor of the silicon oxide on the surface of the film substrate to thereby form the silicon oxide vapor deposition film, the resulting silicon oxide vapor deposition film will function as a highly reliable gas barrier film. The present invention has been completed on the bases of these findings.

Accordingly, the present invention provides the following sintered silicon oxide for film vapor deposition, its production, and a method for producing a silicon oxide vapor deposition film.

[1] A sintered silicon oxide for film vapor deposition having a density of 1.0 to 2.0 g/cm$^3$, three-point flexural strength of at least 50 g/mm$^2$, and a BET specific surface area of 0.1 to 20 m$^2$/g.

[2] A method for producing a sintered silicon oxide for film vapor deposition of the above [1] wherein a mixture of a powder of silicon oxide represented by the formula: SiO$_x$ (wherein $1 \leq x < 1.2$) and a powder of silicon dioxide (SiO$_2$) is molded, and then sintered in a non-oxidizing atmosphere at a temperature of 700 to 1400° C.

[3] A method for producing a sintered silicon oxide for film vapor deposition according to the above [2] wherein the powder of the silicon oxide represented by the formula: SiO$_x$ (wherein $1 \leq x < 1.2$) and the silicon dioxide (SiO$_2$) powder are mixed at a weight ratio SiO$_2$/SiO$_x$ in the range of $0.05 \leq SiO_2/SiO_x \leq 1.0$.

[4] A method for producing a sintered silicon oxide for film vapor deposition according to the above [2] or [3] wherein the powder of the silicon oxide represented by the formula: SiO$_x$ (wherein $1 \leq x < 1.2$) has an average particle diameter of 0.3 to 100 μm.

[5] A method for producing a sintered silicon oxide for film vapor deposition according to any one of the above [2] to [4] wherein silicon dioxide (SiO$_2$) has a BET specific surface area of at least 30 m$^2$/g.

[6] A method for producing a silicon oxide vapor deposition film on a film substrate comprising the steps of heating the sintered silicon oxide for film vapor deposition of the above [1] to produce the vapor of the silicon oxide and depositing the silicon oxide on the surface of the film substrate.

By using the sintered silicon oxide for film vapor deposition of the present invention for the evaporation source of a film, pin holes and other defects of the film caused by the problematic splash phenomenon can be reliably prevented and stable production of a reliable package material having excellent gas barrier property is enabled. In addition, the present method for producing the sintered silicon oxide for film vapor deposition is a method which can be used in a large scale production without requiring any special technology, and therefore, this method is capable of supplying the market with the sintered silicon oxide at a reduced cost.

DETAILED DESCRIPTION OF THE INVENTION

Next, the present invention is described in detail.

The sintered silicon oxide for film vapor deposition of the present invention is a sintered body obtained by sintering the powder of starting materials such as silicon oxide and silicon dioxide both comprising oxygen and silicon. In order to suppress the splash which is a serious problem in the vapor deposition of the silicon oxide, it is effective that the sintered silicon oxide has a constant density and a constant specific surface area. It is also effective that the sintered body has an improved strength.

Accordingly, the sintered silicon oxide has a density of 1.0 to 2.0 g/cm$^3$, and preferably 1.1 to 1.8 g/cm$^3$. When the density is less than 1.0 g/cm$^3$, strength of the sintered body will be insufficient to detract from handling convenience. In addition, the sintered body may break during the electron-beam vapor deposition, and this may invite occurrence of the splash. On the contrary, the sintered body having a density in excess of 2.0 g/cm$^3$ may have an improved strength while the strength is of the level exceeding the strength required for maintaining the handling convenience. Production of such sintered body is also difficult. It is to be noted that the density is a value measured by Archimedes method.

Also, the sintered silicon oxide preferably has a three-point flexural strength of at least 50 g/mm$^2$, and more preferably at least 100 g/mm$^2$. When the three-point flexural strength is less than 50 g/mm$^2$, handling convenience may become insufficient. In addition, the sintered body may break during the electron-beam vapor deposition, and this may invite occurrence of the splash. Upper limit of the three-point flexural strength is not particularly set. However, the upper limit is typically up to 1000 g/mm$^2$. It is to be noted that the three-point flexural strength has been measured according to JIS R 1601.

In the meanwhile, the sintered silicon oxide has a BET specific surface area of 0.1 to 20 m$^2$/g, and preferably 0.3 to 10 m$^2$/g. Production of the sintered silicon oxide having a BET specific surface area of less than 0.1 m$^2$/g is difficult. In contrast, the sintered silicon oxide having a BET specific surface area in excess of 20 m$^2$/g has insufficient strength to detract from the handling convenience. In addition, the sintered body may break during the electron-beam vapor deposition, and this may invite occurrence of the splash. It is to be noted that the BET specific surface area is the value measured by BET one point method based on the adsorption of the N$_2$ gas.

As described above, the sintered silicon oxide for film vapor deposition of the present invention has the physical properties as described above. Such sintered silicon oxide for film vapor deposition can be produced by molding a mixture of the powder of the silicon oxide represented by the formula: SiO$_x$ ($1 \leq x < 1.2$) and the silicon dioxide (SiO$_2$) powder, and sintering the molded article.

The powder of the silicon oxide represented by the formula: SiO$_x$ ($1 \leq x < 1.2$) is produced by a method known in the art, for example, by heating a silicon dioxide-based oxide powder such as fumed silica and colloidal silica with a substance which reduces such oxide powder, for example, a powder mixture of a metal silicon and carbon in an inert gas or under reduced pressure to a temperature in the range of 1100 to 1600° C. for generation of silicon monoxide gas; allowing this silicon monoxide gas to precipitate on the surface of the substrate; and pulverizing the precipitated to a predetermined grain size.

The thus obtained silicon oxide powder is not particularly limited for its physical properties. However, this silicon oxide powder preferably has an average particle diameter of 0.3 to 100 μm, and in particular, 0.5 to 80 μm. Use of the silicon oxide powder having an average particle diameter below such range may result in an extreme increase in the cost of pulverization in relation to the only slight increase in the strength of the sintered body. On the contrary, an average particle diameter exceeding such range results in the decrease in the area of contact between the particles, and the sintered body using such powder may suffer from insufficient strength. It is to be noted that the average particle diameter is the value measured in terms of a weight average (or a median diameter) in the measurement of the particle size distribution using laser diffractometry.

On the other hand, the silicon dioxide powder mixed with the powder of the silicon oxide represented by the formula: SiO$_x$ ($1 \leq x < 1.2$) plays the role of sintering aid which maintains the shape. The silicon dioxide powder is not particularly limited for its type, while the preferred are fumed silica and colloidal silica having a large specific surface area. The silicon dioxide powder is also not particularly limited for its physical properties, while the BET specific surface area is preferably at least 30 m$^2$/g, and in particular, at least 50 m$^2$/g. Use of the silicon dioxide powder having a BET specific surface area below such range may result in the insufficient strength of the sintered body to detract from the handling convenience. In addition, the sintered body may break during the electron-beam vapor deposition, and this may invite occurrence of the splash. The silicon dioxide powder is not particularly limited for the upper limit of the BET specific surface area. The upper limit, however, is typically up to 500 m$^2$/g.

The powder of the silicon oxide represented by the formula: SiO$_x$ ($1 \leq x < 1.2$) and the silicon dioxide powder are used as a mixture after their mixing. The powder of the silicon oxide represented by the formula: SiO$_x$ ($1 \leq x < 1.2$) and the silicon dioxide powder are preferably mixed at a weight ratio (SiO$_2$/SiO$_x$) of $0.05 \leq$ SiO$_2$/SiO$_x \leq 1.0$, and in particular, $0.1 \leq$ SiO$_2$/SiO$_x \leq 0.8$. When the SiO$_2$/SiO$_x$ ratio is below such range, the proportion of the SiO$_2$, which is the sintering aid will be unduly low, and the sintered body will not have sufficient strength. On the contrary, when the SiO$_2$/SiO$_x$ ratio is in excess of such range, proportion of the SiO$_x$ which is the main material to be deposited will be reduced, and efficient deposition of the gas barrier film on the substrate film may not be available, while the strength may be maintained.

The apparatus and the method used for the mixing of the powder of the silicon oxide represented by the formula: SiO$_x$ ($1 \leq x < 1.2$) with the silicon dioxide powder is not particularly limited, and typical method used include tumbling mixing, mechanical agitation, and turbulent agitation. Water may also be added to facilitate the molding, and in this case, the amount of the water added is preferably 20 to 100% by weight in relation to the mixed powder.

Next, the mixed materials are molded in the desired shape and size. The shape of the sintered body is typically a pillar or cube, and the shape may be adequately selected depending on the apparatus used for the vacuum deposition. The size is not particularly limited since the size depends on the size of the apparatus used for the vacuum deposition. Typically, the width is about 30 to 300 mm, the length is about 30 to 300 mm, and the thickness is about 30 to 300 mm.

The method used for the molding is not particularly limited, and exemplary methods include cast molding, plastic molding, injection molding, cold isostatic pressing, and compression molding, and among these, the preferred is compression molding using a mold in view of the ease of handling. When water has been added in the mixing, the molded article is dried after the molding, and the method used for this drying is also not particularly limited. Typically, the drying is effected in vacuum, in the atmosphere, or in an inert gas at a temperature in the range of 80 to 500° C.

The sintered silicon oxide for film vapor deposition of the present invention can be produced by sintering the molded article produced by such method. The sintering furnace used is not particularly limited, and the sintering can be adequately carried out either a continuous method or by a batch wise method. The atmosphere used is not particularly limited as long as it is a non-oxidating atmosphere, and the sintering may be carried out in vacuum or in an inert gas such as Ar, He, or H$_2$ typically at or near normal pressure.

The temperature used for the sintering is preferably 700 to 1400° C., and in particular, 800 to 1300° C. When the sintering is conducted at a temperature lower than such range, the silicon dioxide powder added does not act as the sintering aid, and the resulting sintered body may have an insufficient strength. On the contrary, when the sintering is conducted at a temperature higher than such range, the powder of the silicon oxide represented by the formula: SiO$_x$ ($1 \leq x < 1.2$) will evaporate, and the resulting sintered body may become porous with reduced density as well as strength. In particular, in the case of vacuum, when the sintering is conducted at a high temperature in excess of 1200° C., the powder of the silicon oxide represented by the formula: SiO$_x$ ($1 \leq x < 1.2$) in the sintered body may evaporate, and the sintering is preferably carried out at a temperature of up to 1200° C. in the case of using vacuum. When the sintering is conducted at a higher temperature, the sintering is preferably carried out in an inert gas around the normal pressure.

The sintered silicon oxide for film vapor deposition of the present invention is useful as a silicon oxide source for forming a silicon oxide vapor deposition film on the surface of the film substrate by vapor deposition. Examples of the organic polymer used for the film substrate include polyethylene, polypropylene, polyethylene terephthalate, polyethylene-2, 6-naphthalate, nylon 6, nylon 4, nylon 66, nylon 12, polyvinyl chloride, polyvinylidene chloride, polyvinyl alcohol, polyamide imide, polyimide, polyether imide, polysulfone, polyphenyl sulfide, polyphenylene oxide, and a copolymer of two or more monomers constituting such organic polymer, which may be used alone or in combination of two or more.

The method used for depositing a silicon oxide vapor deposition film on the film substrate by using the sintered silicon oxide for film vapor deposition of the present invention is not particularly limited, and any method known in the art can be employed, for example, by heating the sintered silicon oxide in a vacuum chamber by resistance heating, electron-beam heating, or the like to thereby evaporate the sintered silicon oxide and deposit the silicon oxide vapor deposition film on the film substrate.

EXAMPLES

Next, the present invention is described in further detail by referring to the following Examples and Comparative Examples, which ay no means limit the scope of the present invention.

Example 1

5 kg of an equimolar mixture of a metal silicon powder having an average particle diameter of 5 μm and a fumed silica having a BET specific surface area of 200 m$^2$/g was charged in a vacuum furnace, and the reaction was allowed to proceed in vacuum at 1400° C. for 5 hours. The thus produced SiO gas was precipitated on a SUS substrate to obtain a mass of SiO$_x$ (x=1.03). Next, this mass of SiO (x=1.03) was pulverized in a ball mill to produce a powder of SiO (x=1.03) having an average particle diameter of 8 μm.

Next, to 400 g of SiO$_x$ (x=1.03) powder having an average particle diameter of 8 μm was added 100 g of a fumed silica having a BET specific surface area of 200 m$^2$/g, and the mixture was stirred in an agitator. Agitation was continued after adding 200 g of water to produce a mixture of SiO$_x$ (x=1.03) and fumed silica.

Next, all of the thus obtained fumed silica mixture was filled in a mold having a width of 125 mm and a length of 200 mm, and a pressure of 150 kg/cm$^2$ was applied. The resulting molded article was dried in an atmosphere of 150° C. for 10 hours. The molded article was the placed in a batch furnace, and the article was sintered at normal pressure at 1200° C. for 3 fours with Ar introduced at 5 NL/min to thereby produce a sintered silicon oxide for film vapor deposition (with the width of 121 mm, length of 192 mm, and thickness of 15 mm).

The resulting sintered body had a density of 1.5 g/cm$^3$, a three-point flexural strength of 250 g/mm$^2$, and a BET specific surface area of 2.1 m$^2$/g. These physical properties were measured by the procedure as described below (also in the following Comparative Examples).

Density: Measured by Archimedean method.
Three-point flexural strength:
Measured according to JIS R 1601
BET specific surface area:
Measured by BET 1 point method by mean of $N_2$ gas adsorption.

Next, this silicon oxide was heated in a vacuum chamber by electron beam to observe the occurrence of splash. Substantially no occurrence splash was observed to confirm that this material was well suited for use as a silicon oxide for film deposition.

Comparative Example 1

The procedure of Example 1 was repeated except that the sintering was conducted at a temperature of 650° C. to produce the sintered silicon oxide for film vapor deposition.

The resulting sintered body had a density of 0.9 g/cm³, a three-point flexural strength of 40 g/mm², and a BET specific surface area of 32.8 m²/g.

Next, this sintered body of silicon oxide was heated in a vacuum chamber by electron beam to observe the occurrence of splash. Severe splash was observed after the collapse of the sintered body, and it was inadequate for use as a sintered silicon oxide for film vapor deposition.

Comparative Example 2

The procedure of Example 1 was repeated except that the sintering was conducted at a temperature of 1450° C. to produce the sintered silicon oxide for film vapor deposition.

The resulting sintered body had a density of density of 0.8 g/cm³, a three-point flexural strength of 35 g/mm², and a BET specific surface area of 1.3 m²/g. The resulting sintered body was porous (i.e., with a large void volume) due to the evaporation of the $SiO_x$ (x=1.03) in the sintered body, and it was obviously inadequate for use as a sintered silicon oxide for film vapor deposition.

Japanese Patent Application No. 2008-062071 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A silicon oxide vapor deposition film comprising a film substrate composed of an organic polymer and a sintered silicon oxide deposited on the surface of the film substrate,
wherein the sintered silicon oxide has:
(1) a density of 1.0 to 2.0 g/cm³,
(2) a three-point flexural strength of at least 50 g/mm², and
(3) BET specific surface area of 0.1 to 20 m²/g,
wherein the sintered silicon oxide is formed by sintering a mixture of (a) a powder of silicon oxide represented by the formula:
$SiO_x$
wherein $1 \leq x < 1.2$, and
(b) a powder of silicon dioxide ($SiO_2$) having a BET surface area of at least 30 m²/g, at a weight ratio $SiO_2/SiO_x$ in the range of $0.05 \leq 1.0$.

2. The film of claim 1, wherein the sintered silicon oxide has a density of 1.1 to 1.8 g/cm³.

3. The film of claim 1, wherein the sintered silicon oxide has a three-point flexural strength of at least 100 g/mm².

4. The film of claim 1, wherein the sintered silicon oxide has a three-point flexural strength of 50 to 1000 g/mm².

5. The film of claim 1, wherein the sintered silicon oxide has a three-point flexural strength of 100 to 1000 g/mm².

6. The film of claim 1, wherein the sintered silicon oxide has a BET specific surface area of 0.3 to 10 m²/g.

7. The film of claim 1, wherein the silicon dioxide powder has an average particle diameter of 0.5 to 80 μm.

8. The film of claim 1, wherein the silicon dioxide powder has a BET specific surface area of at least 50 m²/g.

9. The film of claim 1, wherein the silicon dioxide powder has a BET specific surface area of 30 to 500 m²/g.

10. The film of claim 1, wherein the silicon dioxide powder has a BET specific surface area of 50 to 500 m²/g.

* * * * *